United States Patent
Boja et al.

(10) Patent No.: US 10,438,863 B1
(45) Date of Patent: Oct. 8, 2019

(54) CHIP PACKAGE ASSEMBLY WITH SURFACE MOUNTED COMPONENT PROTECTION

(71) Applicant: Xilinx, Inc., San Jose, CA (US)

(72) Inventors: Ronilo Boja, Gilroy, CA (US); Inderjit Singh, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/138,671

(22) Filed: Sep. 21, 2018

(51) Int. Cl.
*H01L 23/31* (2006.01)
*H01L 21/52* (2006.01)
*H01L 23/488* (2006.01)

(52) U.S. Cl.
CPC .......... *H01L 23/3114* (2013.01); *H01L 21/52* (2013.01); *H01L 23/488* (2013.01)

(58) Field of Classification Search
CPC .......................... H01L 23/3114; H01L 23/488
See application file for complete search history.

(56) References Cited

U.S. PATENT DOCUMENTS

| 6,114,763 | A  | * | 9/2000 | Smith | H01L 21/563 257/692 |
| 6,940,182 | B2 |   | 9/2005 | Hilton et al. | |
| 7,883,937 | B1 | * | 2/2011 | Kang | H01L 21/563 257/687 |
| 8,476,115 | B2 | * | 7/2013 | Choi | H01L 21/50 257/659 |
| 9,368,422 | B2 | * | 6/2016 | Zhang | H01L 24/32 |
| 9,627,329 | B1 |   | 4/2017 | Kwon et al. | |
| 2012/0187583 | A1 |   | 7/2012 | Karpur et al. | |

* cited by examiner

*Primary Examiner* — Peniel M Gumedzoe
(74) *Attorney, Agent, or Firm* — Robert M. Brush

(57) ABSTRACT

A chip package assembly, a package substrate and methods for fabricating the same are disclosed herein. In one example, a chip package assembly includes a package substrate, an IC die and a stiffener. The package substrate includes a first dam projecting from a top surface of the package substrate. The IC die and the stiffener are mounted to the top surface of the package substrate. The stiffener includes a bottom surface that is disposed adjacent to the first dam. At least one surface mounted component is mounted to a region of the package substrate defined between the stiffener and the IC die. An adhesive coupling the stiffener to the package substrate is in contact with the first dam.

20 Claims, 5 Drawing Sheets

US 10,438,863 B1

CHIP PACKAGE ASSEMBLY WITH SURFACE MOUNTED COMPONENT PROTECTION

TECHNICAL FIELD

Embodiments of the present disclosure generally relate to chip package assemblies and techniques for manufacturing the same. In particular, to a chip package assembly are described herein having features that mitigate adhesive and/or underfill from contacting surface mounted components, such as capacitors and the like.

BACKGROUND ART

Electronic devices, such as tablets, computers, server, in-door telecom, outdoor telecom, industrial computers, high performance computing data centers, copiers, digital cameras, smart phones, control systems and automated teller machines, among others, often employ electronic components which leverage chip package assemblies for increased functionality and higher component density. Conventional chip package assemblies include one or more stacked components such as integrated circuit (IC) dies, through-silicon-via (TSV) interposer, and a package substrate, with the chip package assembly itself stacked on a printed circuit board (PCB). The IC dies may include memory, logic, MEMS, RF or other IC device.

Surface mounted components, such as capacitors, resistors, and the like, are often utilized in chip package assemblies. The surface mounted components are typically mounted to a package substrate laterally to the side and outward of the dies that are mounted to the package substrate. The surface mounted components are typically mounted between the dies and a stiffener, if utilized, which is generally mounted at the periphery of the of the package substrate.

Often underfill, utilized between the die and the package substrate, may flow out from beneath the die and come in contact with the surface mounted component, which is considered a production defect. Similarly, adhesives utilized to attach the stiffener to the package substrate may also flow out from beneath the stiffener and come in contact with the surface mounted component, which is also considered a production defect. Thus, to minimize the potential for production defects due to underfill and/or adhesive contact with surface mounted components, the surface mounted components must be sufficiently spaced from both the dies and the stiffener, which undesirably reduces the space available for dies or undesirably requires a larger package substrate.

Therefore, a need exists for an improved chip package assembly that mitigates adhesive and/or underfill from contacting surface mounted components as compared what is conventionally available in the art.

SUMMARY

A chip package assembly, a package substrate, and methods for fabricating the same are disclosed herein. In one example, a chip package assembly includes a package substrate, an IC die and a stiffener. The package substrate includes a first dam projecting from a top surface of the package substrate. The IC die and the stiffener are mounted to the top surface of the package substrate. The stiffener includes a bottom surface that is disposed adjacent to the first dam. At least one surface mounted component is mounted to a region of the package substrate defined between the stiffener and the IC die. An adhesive coupling the stiffener to the package substrate is in contact with the first dam.

In another example, a chip package assembly includes a package substrate, an IC die and a stiffener. The package substrate has a first side from with a first dam and a second dam project. The second dam is outward of the first dam. The IC die and the stiffener are mounted to the top surface of the package substrate. At least one surface mounted component is mounted to a region of the package substrate defined between the stiffener and the IC die. An adhesive couples the stiffener to the package substrate. The adhesive is in contact with the first dam and the second dam.

In another example, a method for fabricating a package substrate is provided. The method includes forming at least a first dam on a top surface of a package substrate. The first dam is formed outward of an area configured to receive a die mounted thereon. The first dam is configured to inhibit the flow of underfill in a direction towards surface mounted components disposed on the top surface of the package substrate. Optionally, a second dam may be formed under or just inward of a stiffener. The second dam is configured to inhibit the flow of stiffener adhesive in a direction towards surface mounted components disposed on the top surface of the package substrate. Optionally, the first and/or second dam may be formed from a dielectric layer that is deposited on top of a dielectric layer through which contact pads are exposed.

In yet another example, a method for fabricating a chip package assembly is provided. The method includes coupling an IC die to a top surface of a package substrate; disposing a stiffener on the top surface of the package substrate; and displacing an adhesive disposed between the stiffener and the package substrate into contact with a first dam.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosure generally provide chip package assemblies, and package substrates, that mitigate the potential for adhesive and/or underfill from contacting surface mounted components. The chip package assemblies package substrates and techniques for manufacturing the same advantageously increase product yield by utilizing dams to essentially prevent adhesive and/or underfill from contacting surface mounted components. Moreover, reliability is improved by insuring consistent surface contact area between the package substrate and the stiffener, which reduces the potential for delamination due by controlling adhesive flow. Other advantages include improved signal integrity due to closer spacing between surface mounted components and dies, smaller package substrate area requirements, and improved package warpage resistance was wider stiffeners may be accommodated due to smaller stiffener to die requirements without increase in package substrate size.

Figure 1:
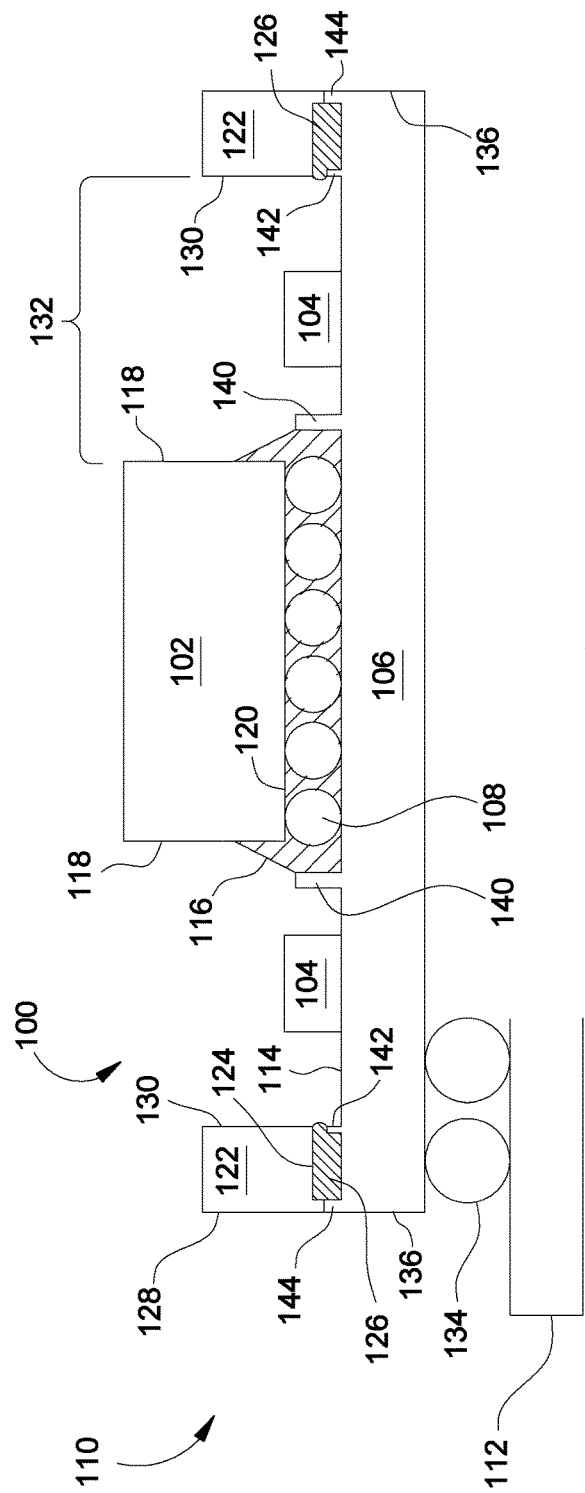
FIG. 1 is a cross sectional schematic view of an integrated chip package mounted on a printed circuit board.

Turning now to FIG. 1, an integrated circuit electronic device 110 is schematically illustrated having an exemplary integrated chip (IC) package assembly 100 mounted on a printed circuit board (PCB) 112 by solder balls 134. The PCB 112 and solder balls 134 are shown in phantom.

The package assembly 100 generally includes one or more or more IC dies 102, a package substrate 106, one or more surface mounted components 104, and a stiffener 122. It is contemplated that the stiffener 122 may be optional in embodiments where control of underfill flow is the primary concern. The IC dies 102 may be programmable logic devices, such as field programmable gate arrays (FPGA), memory devices, optical devices, processors or other IC logic structures. Optical devices include photo-detectors, lasers, optical sources, and the like.

The IC dies 102 are connected directly to the package substrate 106, for example as flip chip ball grid array (FCBGA), ball grid array (BGA), wire bond and the like. In another example, one or more IC dies 102 of the chip package assembly 100 may be connected to the package substrate 106 via the interposer (not shown). It is contemplated that the chip package assembly 100 may have other configurations. Although one IC die 102 is shown in FIG. 1, the number of IC dies may range from one to as many as can be fit within the chip package assembly 100 in order to meet design criteria.

A bottom 120 of the IC die 102 is connected to a top surface 114 of the package substrate 106 by solder connections 108. The solder connections 108, such as microbumps, mechanically and electrically connect the circuitry of the IC die 102 to the circuitry of the package substrate 106.

Underfill 116 is disposed in the interstitial spaces between the bottom 120 of the IC die 102 and the top surface 114 of the package substrate 106, thereby providing structural rigidity to the chip package assembly 100. The underfill 116 also surrounds and protects the solder connections 108. The underfill 116 may be an epoxy or other suitable material.

The stiffener 122 is generally mounted at a peripheral edge 136 of the package substrate 106 and circumscribes the IC die 102. In the example illustrated in FIG. 1, an outer side 128 of the stiffener 122 is substantially aligned with the peripheral edge 136 of the package substrate 106 while an inner side 130 of the stiffener 122 faces and is spaced apart from the IC die 102.

The stiffener 122 is attached to the top surface 114 of the package substrate 106 by an adhesive 126. The adhesive 126 may be an epoxy or other suitable bonding material. The stiffener 122 provides mechanical support which helps prevent the chip package assembly 100 from bowing and warping. The stiffener 122 may be a single layer structure or a multi-layer structure. The stiffener 122 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 122 can also be made of organic materials such as copper-clad laminate.

The surface mounted components 104 are coupled to the top surface 114 of the package substrate 106 in a region (i.e., space) 132 defined between the inner side 126 of the stiffener 122 and the side 118 of the die 102. The surface mounted components 104 may be one or more of a capacitor, diode, resistor, inductor, or other suitable discrete circuit element. The surface mounted components 104 are soldered to a conductor residing on or in the package substrate 106, and are coupled to the circuitry of the die 102 through the circuity of the package substrate 106.

The space 132 required to robustly attach the surface mounted components 104 to the top surface 114 of the package substrate 106 is advantageously reduced by techniques configured to reduce the flow of adhesive 126 and/or underfill 116 into the space 132. In first example, a first dam 140 is disposed on the top surface 114 of the package substrate 106 proximate the side 118 of the die 102 to control the flow of underfill 116 out from under the die 102 and into the space 132. In second example, a second dam 142 is disposed on the top surface 114 of the package substrate 106 proximate the inner side 130 of the stiffener 122 to control the flow of adhesive 126 out from under the stiffener 122 and into the space 132. The first dam 140 may be utilized with or without the second dam 142. Similarly, the second dam 142 may be utilized with or without the first dam 140. Utilizing one of more of the dams 140, 142 reduces the probability of contact of the adhesive 126 and/or underfill 116 from coming in contact with the surface mounted components 104, thus allowing a shorter distance across the space 132 between the inner edge 130 of the stiffener 122 and side 118 of the die 102. This shorter distance across the space 132 advantageously allows for a smaller package substrate 106, shorter distances between the surface mounted components 104 and the die 102 which enables faster communication and better signal integrity. Additionally, shorter requirements for the space 132 desirably contributes to increased warpage resistance and generally a less costly but more robust chip package assembly 100.

In another example, a third dam 144 is disposed on the top surface 114 of the package substrate 106 proximate the outer side 128 of the stiffener 122 to control the flow of adhesive 126 out from under the stiffener 122 and extending beyond the peripheral edge 136 of the stiffener 122. Thus, the third dam 144 substantially prevents adhesive 126 from extending beyond the peripheral edge 136 of the package substrate 102 which may inadvertently prevent the package assembly 100 from being utilized in it intended location.

Figure 2:
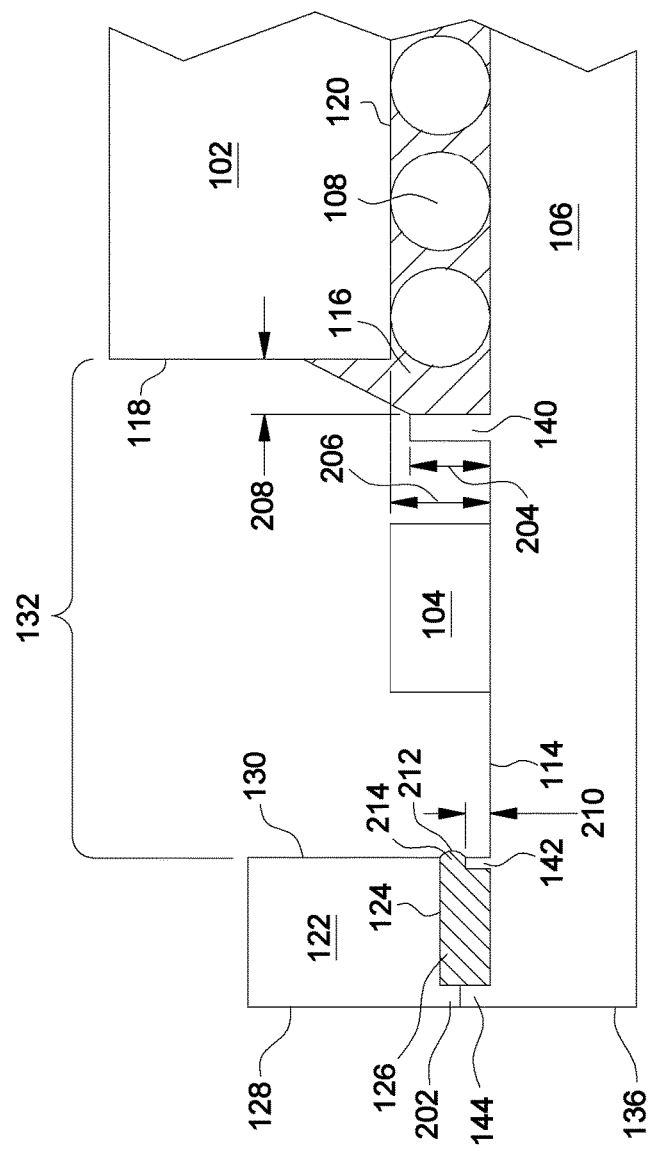
FIG. 2 is a partial schematic view of the integrated chip package of FIG. 1.

FIG. 2 is a partial sectional view of the chip package assembly 100 illustrating the dams 140, 142, 144 in greater detail. As noted above, the chip package assembly 100 may be configured in various embodiments having at least one or more of the dams 140, 142, 144 in any combination.

The first dam 140 extends upward from the top surface 114 of the package substrate 106 in a manner that prevents the free flow of underfill 116 from flowing out from under the die 102. The dam 140 is generally spaced a distance 208 from the side 118 of the die 102 to allow a dispensing tool, such as a needle (not shown), to dispense the underfill 116 into a gap 206 defined under the die 102 between the bottom 120 of the die 102 and the top surface 114 of the package substrate 106. In one example, the first dam 140 has a height 204 that is less than a distance across the gap 206, which enhances access of the dispensing tool to the gap 206. In one example, the height 204 of the first dam 140 is sufficiently tall enough to cause the underfill 116 to flow upward and in contact with the side 118 of the die 102 while still substantially preventing the flow of underfill 116 into the portion of the space 132 defined between the first dam 140 and the surface mounted components 104. Thus, the first dam 140 advantageously directs excess underfill 116 preferentially upwards along the side 118 of the die 102 and away from the surface mounted components 104 without having to utilize precise amounts of underfill 116, which ensures good adhesion between the die 102 and the package substrate 106.

In one example, the first dam 140 may be part of the top surface 114 of the package substrate 106. In another example, the first dam 140 may be a separate component disposed or formed on the top surface 114 of the package substrate 106.

Similarly, the second dam 142 extends upward from the top surface 114 of the package substrate 106 in a manner that prevents the free flow of adhesive 126 from flowing out from under the stiffener 122. In the example depicted in FIG. 2, the second dam 144 is disposed under the stiffener 122. However, the second dam 144 may alternatively be disposed in the space 132 immediately adjacent the stiffener 122. In one example, the second dam 142 has a height 210 that allows a gap 214 to be formed between the bottom 214 of the stiffener 122 and the top of the second dam 142. The gap 214 allows a portion 212 of the adhesive 126 to extrude through the gap 214 when the stiffener 122 is mounted to the top surface 114 of the package substrate 106. The lateral motion of the adhesive 126 as it is squeezed out the gap 214 upon mounting of the stiffener 122 ensures that the adhesives 126 is thoroughly, continuously and uniformly distributed between the stiffener 122 and the package substrate 106, thus producing a robust bond between the stiffener 122 and the package substrate 106. The second dam 142 also advantageously reduces the probability of excess adhesive 126 contacting the surface mounted components 104.

As with the first dam 140, the second dam 142 may be part of the top surface 114 of the package substrate 106. In another example, the second dam 142 may be a separate component disposed or formed on the top surface 114 of the package substrate 106.

Similarly, the third dam 144, when utilized, extends upward from the top surface 114 of the package substrate 106 in a manner that prevents the free flow of adhesive 126 from flowing out from under the stiffener 122 and beyond the peripheral edge 136 of the package substrate 106. Since the third dam 144 contacts the stiffener 122, reliable and repeatable spacing between the stiffener 122 and the package substrate 106 is established that improves bonding and warpage resistance. The reliability of the attachment of the stiffener 122 to the package substrate 106 is thus improved by insuring consistent surface contact area between the package substrate and the stiffener, which reduces the potential for delamination due by controlling adhesive flow.

In the example depicted in FIG. 2, the second dam 144 is disposed under the stiffener 122 and abuts a lip 202 extending from the bottom 124 of the stiffener 122 along the outer side 128 of the stiffener 122. The heights of the lip 202 and third dam 144 are selected to ensure the gap 214 is formed along the inner side 130 of the stiffener 122 such that any displacement of adhesive 126 out from under the stiffener 122 is preferentially directed inward towards the surface mounted components 104 through the gap 214. Thus, the dam 144 and lip 202 advantageously prevents adhesive 126 from being present on the peripheral edge 136 of the package substrate 106 or the outer side 128 of the stiffener 122 where the adhesive 126 could potentially interfere with the chip package assembly 100 from properly interfacing with test sockets and the like. It is also contemplated that the third dam 144 may have a height sufficiently greater than the height 210 of the second dam 142 to ensure the gap 214 is formed even if the stiffener 122 does not have a lip 202.

As with the first and second dams 140, 142, the third dam 144 may be part of the top surface 114 of the package substrate 106. In another example, the third dam 144 may be a separate component disposed or formed on the top surface 114 of the package substrate 106.

Figure 3:
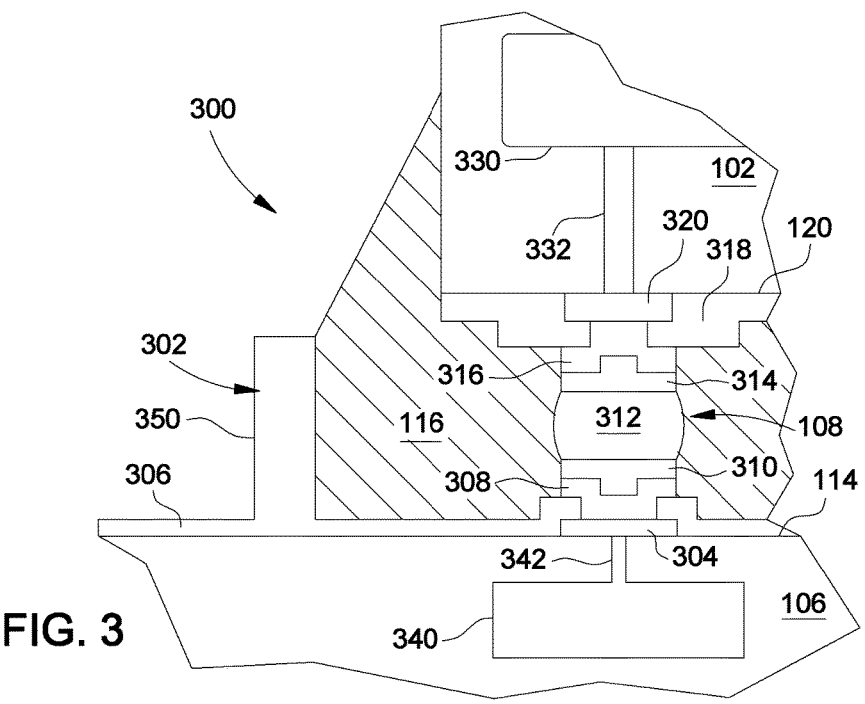
FIG. 3 is a partial schematic view of a portion of another integrated chip package.

FIG. 3 is a partial schematic view of a portion of another integrated chip package assembly 300. Although only a portion of the chip package assembly 300 is illustrated in FIG. 3, the chip package assembly 300 is substantially the same as the chip package assembly 100 depicted in FIGS. 1-2, except wherein at least a first dam 302 is fabricated from a layer of dielectric material, such as solder mask material, deposited on a top surface 114 of a package substrate 106.

Similar to as discussed above, a die 102 of the chip package assembly 300 is coupled to the top surface 114 of the package substrate 106 utilizing solder connections 108. As shown in FIG. 3, a solder connection 108 couples the contact pads 304, 320 that are respectively formed on the package substrate 106 and the die 102. The contact pad 304 is coupled by solid state routing 342 to solid state circuity 340 formed in the package substrate 106. Likewise, the contact pad 320 is coupled by solid state routing 332 to solid state circuity 330 formed in the die 102. The circuitry 330 of the die 102 enables the functionality of the die 102, such as, but not limited to, a logic or memory device.

The contact pad 304 is formed on the top surface 114 of the package substrate 106. A first dielectric layer 306, covers the top surface 114 of the package substrate 106 and includes an opening through which a portion of the contact pad 304 is exposed. The dielectric layer 306 may be a solder mask material or other suitable dielectric material. The dielectric layer 306 is generally deposited and patterned to form the opening utilizing a first mask.

An underbump metal layer (UBM) 308 is disposed on the contact pad 304 through the opening in the dielectric layer 306. The UBM layer 308 may be formed from copper or other suitable electrically conductive material.

A conductive pillar 310 is disposed on the UBM layer 308. The conductive pillar 310 is in electrical communication with the contact pad 304 through the UBM layer 308. The conductive pillar 310 may be formed from copper or other suitable electrically conductive material.

Similarly, the contact pad 320 is formed on a bottom 120 of the die 102. A dielectric layer 318, covers the bottom 120 of the die 102 and includes an opening through which a portion of the contact pad 340 is exposed. The dielectric layer 318 may be a solder mask material or other dielectric material.

A UBM layer 316 is disposed on the contact pad 320 through the opening in the dielectric layer 318. The UBM layer 316 may be formed from copper or other suitable electrically conductive material.

A conductive pillar 314 is disposed on the UBM layer 316. The conductive pillar 314 is in electrical communication with the contact pad 320 through the UBM layer 316. The conductive pillar 314 may be formed from copper or other suitable electrically conductive material.

The solder connections 108 includes a solder ball 312 that electrically and mechanically couples the conductive pillar 314 and the conductive pillar 310, thus coupling the circuitry 330, 340 through the pads 304, 320. As discussed above with reference to FIGS. 1-2, underfill 116 is disposed in the space defined between the die 102 and package substrate 106.

The first dam 302 is disposed adjacent the die 102 to block the underfill 116 from contacting the surface mounted components 104 disposed in the space 132. The first dam 302 is similar to the first dam 140 described above, except wherein the first dam 302 is fabricated from one or more second dielectric layers 350 formed on the underlying dielectric layer 306 previously formed on the top surface 114 of the package substrate 106. The dielectric layer 350 may be a solder mask material or other suitable dielectric material. In one example, the second dielectric layer 350 is formed utilizing a second mask set, such that the underlying dielectric layer 306 and the second dielectric layer 350 are formed from different mask sets.

During fabrication of the first dam 302, the dielectric layer 306 may first be deposited and formed utilizing a first mask, while the one or more second dielectric layers 350 are formed using one or more second masks that are different than the first mask set. Advantageously, the use of solder mask material for the first dam 302 enables the first dam 302 to be efficiently and precisely made, thus conserving space of other components of the chip package assemblies 100, 300.

Figure 4:
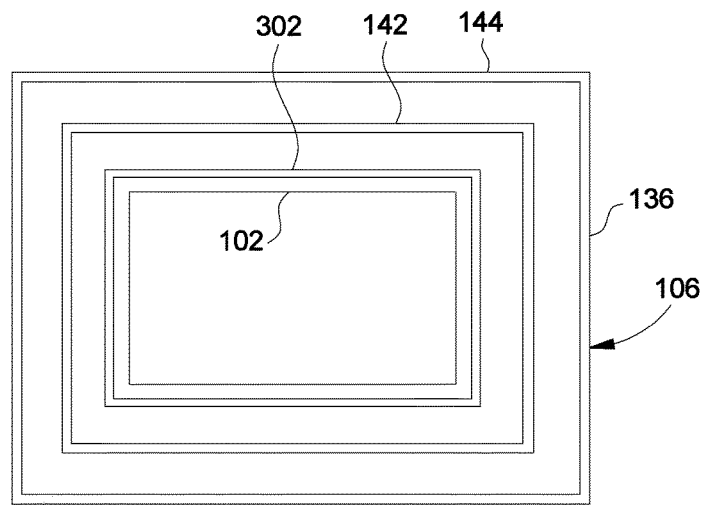
FIG. 4 is a schematic top view of an example of a package substrate.

Referring now to the schematic top view of one example of the package substrate 106 illustrated in FIG. 4, the first dam 302 contiguously circumscribes the the die 102 (shown in phantom). Similarly, the second dam 142 contiguously circumscribes the die 102, while the third dam 144 contiguously circumscribes the second dam 142. The dams 142, 144 may be fabricated as described above, or alternatively, fabricated utilizing a solder resist material or other suitable material. In one example, at least one or both of the dams 142, 144 are fabricated in the same manner as the first dam 302, i.e. using the second dielectric layer 350.

Figure 5:
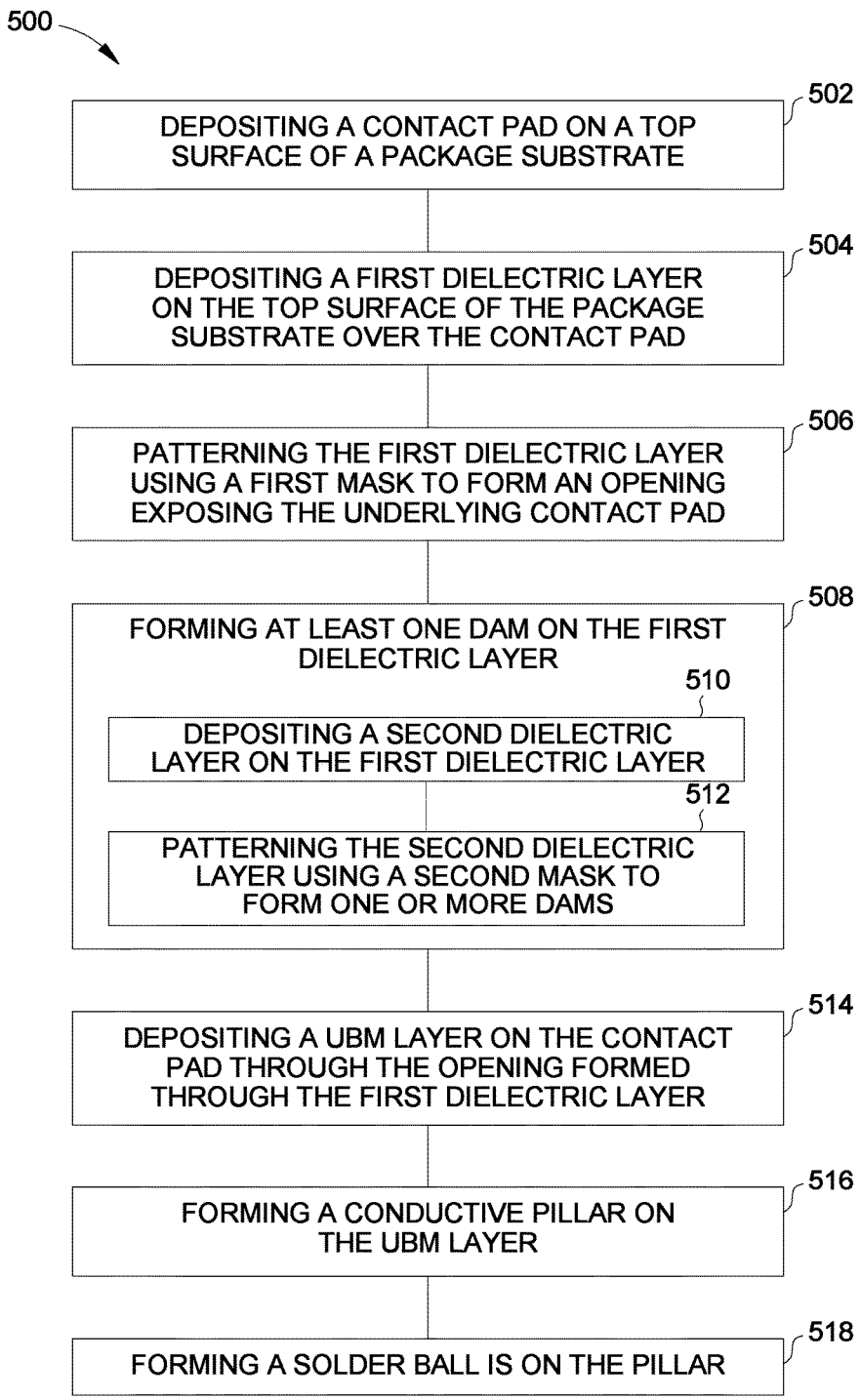
FIG. 5 is a flow diagram of a method for forming a package substrate.

FIG. 5 is a flow diagram of a method 500 for forming a package substrate, such as the package substrate 106 described above, among others. The method 500 begins at operation 502 by depositing a contact pad 304 on a top surface 114 of the package substrate 106. The contact pad 304 is electrically coupled to circuity 340 formed in or on the package substrate 106. In one example, the contact pad 304 is coupled to the circuity 340 by a via 342. The circuity 340 may include one or more traces coupling different contact pads formed on the package substrate 106. The contact pads may be on the same side, or different sides of the package substrate 106. For example, one contact pad may be configured to couple to a solder ball 134 be coupled by the circuitry 340 to another contact pad configured to couple to a solder connection 108.

At operation 504, a first dielectric layer 306 is deposited on the top surface 114 of the package substrate 106 over the contact pad 304. In one example, the first dielectric layer 306 is formed from solder mask material. At operation 506, the first dielectric layer 306 is patterned using a first mask to form an opening exposing the underlying contact pad 304.

At operation 508, at least one dam, such as one or more of the dams 140, 142, 144, are formed on the first dielectric layer 306. The dams may be formed by any suitable technique.

In one example, operation 508 may be performed utilizing a depositing operation 510 and a patterning operation 512. Operation 510 is performed by depositing a second dielectric layer 350 on the first dielectric layer 306. In one example, the second dielectric layer 350 is formed from solder mask material. At operation 512, the second dielectric layer 350 is patterned using a second mask to form one or more dams, such the dams 140, 142, 144.

At operation 514, a UBM layer 308 is deposited on the contact pad 304 through the opening formed through the dielectric layer 306. At operation 516, a conductive pillar 310 is formed on the UBM layer 308.

When the package substrate 106 is ready for having one or more dies 102 mounted thereon, a solder ball 312 is formed on the pillar 310 at operation 518 to facilitate attachment of the dies 102 to the package substrate 106.

Figure 6:
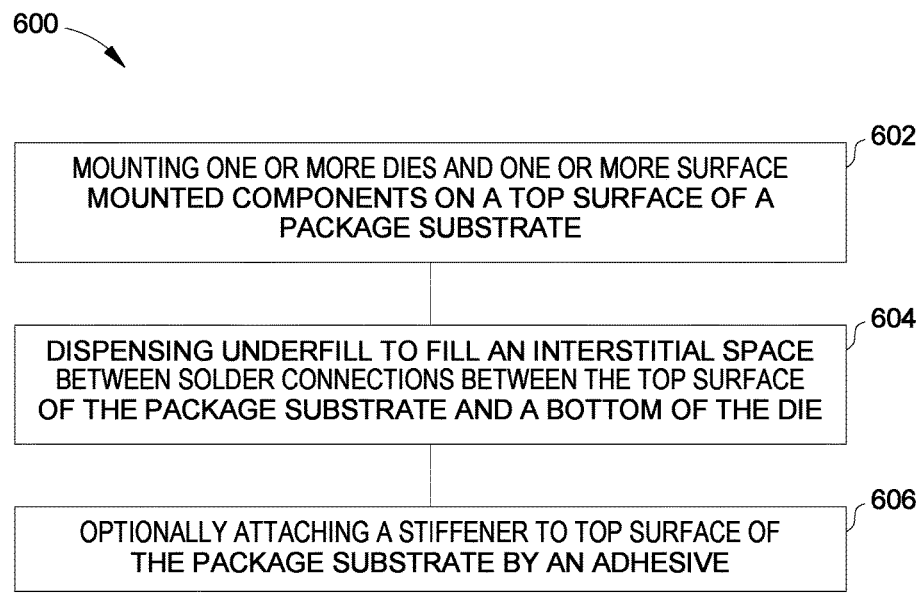
FIG. 6 is a flow diagram of a method for forming a chip package assembly.

FIG. 6 is a flow diagram of a method 600 for forming a chip package assembly, such as the chip package assemblies 100, 300 described above, among others. The method 600 begins at operation 602 by mounting one or more dies 102 and one or more surface mounted components 104 on a top surface 114 of a package substrate 106. The dies 102 and surface mounted components 104 may be mounted to the top surface 114 of the package substrate 106 utilizing conventional or other suitable techniques. The package substrate 106 may be formed utilizing the method 500 described above, or other suitable technique.

At operation 604, underfill 116 is dispensed to fill the interstitial space between solder connections 108 disposed the top surface 114 of the package substrate 106 and the bottom 120 of the die 102. The underfill 116 provides a robust connection between the package substrate 106 and the die 102, while protecting the solder connections 108. Underfill 116 is dispensed at least until a portion of the underfill 116 flowing out from under the die 102 contacts the first dam 140. The first dam 140 redirects the underfill 116 upward along the side 118 of the die 102 while substantially preventing the underfill 116 from flowing past the first dam 140 and into contact with the surface mounted components 104.

Operation 606, a stiffener 122 is attached to top surface 114 of the package substrate 106 by an adhesive 126. During the stiffener attach operation 606, a portion 212 of the adhesive 126 is squeezed out from between the package substrate 106 and the stiffener 122. A second dam 142 generally prevents the portion 212 of the adhesive 126 extruding out from under the stiffener 122 from coming into contact with the surface mounted components 104.

In embodiments wherein a third dam 144 is utilized, the third dam 144 seals directly against a bottom surface 124 or a lip 202 extending from the bottom surface 124 of the stiffener 122 to prevent adhesive 126 from extending beyond the peripheral edge 136 of the package substrate 106 where the adhesive 126 could prevent the package substrate 106 from fitting in test equipment or cause assembly or interface problems. Advantageously, when the third dam 144 is utilized, the third dam 144 causes the adhesive 126 to be displaced laterally towards the second dam 142 as the stiffener 122 is pressed in contact with the top surface 114 of the package substrate 106. The lateral displacement of the adhesive 126 substantially ensures the adhesive 126 is in contact with the entire facing surfaces (114, 124) of the interface between the stiffener 122 and package substrate 106, thus providing a robust, repeatable and reliable bond between the stiffener 122 and package substrate 106. The robust bond also provides improved resistance to warping of the package substrate 106.

Thus, chip package assemblies and package substrates that mitigate the potential for adhesive and/or underfill from contacting surface mounted components, along with techniques for fabricating the same, have been described above. The chip package assemblies, package substrates and techniques for manufacturing the same advantageously increase product yield, provide improved reliability by insuring consistent surface contact area between the package substrate and a stiffener, thus providing greater delamination resistance. Additionally, signal integrity is improved due to the closer spacing between surface mounted components and dies. Furthermore, the embodiments described above allow for smaller package substrate area requirements, and improved package warpage resistance as wider stiffeners may be accommodated due to smaller stiffener to die spacing requirements without an increase in package substrate size.

What is claimed is:

1. A chip package assembly, comprising:
   a package substrate having a first dam projecting from a top surface of the package substrate;
   an IC die mounted to the top surface of the package substrate;
   a stiffener mounted to the top surface of the package substrate, a bottom surface of the stiffener disposed adjacent to and spaced apart from the first dam;
   a surface mounted component mounted to the top surface of the package substrate in a region of the package substrate defined between the stiffener and the IC die; and
   an adhesive coupling the stiffener to the package substrate, the adhesive in contact with the first dam, the first dam configured to control movement of the adhesive out from under the stiffener.

2. The chip package assembly of claim 1 further comprising:
   a second dam, wherein the second dam is positioned at an outer side of the stiffener that faces away from the IC die.

3. The chip package assembly of claim 2, wherein the bottom surface of the stiffener further comprises:
   a lip disposed at least partially over and contacting the second dam.

4. The chip package assembly of claim 1, wherein the first dam is disposed inward of an inner side of the stiffener and outward of the IC die, the first dam configured to control movement of the adhesive towards the surface mounted component.

5. The chip package assembly of claim 2, wherein the package substrate further comprises:
   a third dam disposed between the IC die and the surface mounted component.

6. The chip package assembly of claim 5 further comprising:
   an underfill disposed between the IC die and the package substrate, the underfill contacting the third dam, the underfill extending between a gap defined between the third dam and a side of the IC die.

7. The chip package assembly of claim 6, wherein the third dam is fabricated from solder mask material.

8. The chip package assembly of claim 6, wherein the third dam has a height that is less than a distance defined between the package substrate and the IC die.

9. A chip package assembly, comprising:
   a package substrate having a first side, a first dam projecting from a top surface of the package substrate and a second dam projecting from the top surface of the package substrate outward of the first dam;
   an IC die mounted to the top surface of the package substrate;
   a stiffener mounted to the top surface of the package substrate, a bottom of the stiffener spaced apart from the first dam;
   a surface mounted component mounted to a region of the package substrate defined between the stiffener and the IC die; and
   an adhesive coupling the stiffener to the package substrate, the adhesive in contact with the first dam and the second dam, the first dam configured to control movement of the adhesive towards the surface mounted component.

10. The chip package assembly of claim 9, wherein the second dam is positioned under the stiffener.

11. The chip package assembly of claim 10, wherein a bottom surface of the stiffener comprises:
    a lip aligned with and contacting the second dam.

12. The chip package assembly of claim 9, wherein the package substrate further comprises:
    a third dam disposed outward of the IC die and inward of the surface mounted component.

13. The chip package assembly of claim 12 further comprising:
    an underfill disposed between the IC die and the package substrate, the underfill contacting the third dam.

14. The chip package assembly of claim 13, wherein the third dam is formed from solder mask material.

15. The chip package assembly of claim 12, wherein the third dam has a height that is less than a distance defined between the package substrate and the IC die.

16. A chip package assembly, comprising:
    a package substrate having a first dam projecting from a top surface of the package substrate;
    an IC die mounted to the top surface of the package substrate;
    a stiffener mounted to the top surface of the package substrate, a bottom surface of the stiffener disposed adjacent to the first dam, wherein the bottom surface of the stiffener further comprises a lip disposed at least partially over and contacting the first dam;
    a surface mounted component mounted to a region of the package substrate defined between the stiffener and the IC die; and
    an adhesive coupling the stiffener to the package substrate, the adhesive in contact with the first dam.

17. The chip package assembly of claim 16, wherein the package substrate further comprises:
    an underfill disposed between the IC die and the package substrate; and
    a second dam disposed outward of the IC die and inward of the surface mounted component, the second dam configured to control movement of the underfill towards the surface mounted component.

18. The chip package assembly of claim 17, wherein the second dam is formed from solder mask material.

19. The chip package assembly of claim 18, wherein the second dam has a height that is less than a distance defined between the package substrate and the IC die.

20. The chip package assembly of claim 19 further comprising:
    a third dam disposed under the stiffener and inward of the first dam, the third dam configured to control movement of the adhesive out from under the stiffener towards the surface mounted component.

* * * * *